United States Patent [19]

Young

[11] 4,401,691

[45] Aug. 30, 1983

[54] OXIDATION OF SILICON WAFERS TO ELIMINATE WHITE RIBBON

[75] Inventor: William C. Young, Dallas, Tex.

[73] Assignee: Burroughs Corporation, Detroit, Mich.

[21] Appl. No.: 970,580

[22] Filed: Dec. 18, 1978

[51] Int. Cl.$^3$ .......................................... H01L 21/316
[52] U.S. Cl. ...................................... 427/93; 427/94
[58] Field of Search ...................................... 427/93, 94

[56] References Cited

U.S. PATENT DOCUMENTS

| | | | |
|---|---|---|---|
| 3,900,350 | 8/1975 | Appels | 427/94 |
| 3,913,211 | 10/1975 | Seeds et al. | 29/588 |
| 4,098,924 | 4/1978 | McLouski | 427/93 |
| 4,109,030 | 8/1978 | Briska | 427/93 |
| 4,139,658 | 2/1979 | Cohen | 427/93 |

FOREIGN PATENT DOCUMENTS 2740941 4/1978 Fed. Rep. of Germany ........ 427/93

OTHER PUBLICATIONS

Kooi, "Formation ... in NH, Gas", *J. Electrochemical Society*, vol. 123, No. 7, pp. 1117–1120 (1976).

*Primary Examiner*—John D. Smith
*Attorney, Agent, or Firm*—John J. McCormack; Nathan Cass; Kevin R. Peterson

[57] ABSTRACT

Disclosed is a process for eliminating the migration of nitrogen or nitrogen hydrides (e.g., $NH_3$) to a $Si-SiO_2$ interface site during silicon-nitride-masked oxidation—using an HCl additive to a pyrogenic oxidizing medium to react with the nitrogenous entity and so prevent formation of silicon nitride at this site [e.g., in a die zone intended for later reception of a precise oxide layer]—this improved technique resulting in increased yield, improved reliability and better electrical parameters.

18 Claims, 7 Drawing Figures

4,401,691

OXIDATION OF SILICON WAFERS TO ELIMINATE WHITE RIBBON

INTRODUCTION

The present invention relates generally to improvements in the manufacture of integrated circuit devices, and more particularly to improved techniques for developing oxide films on integrated circuit substrates.

INVENTION BACKGROUND, FEATURES

Workers in the art of making integrated circuit devices are well aware of the need for optimal techniques for developing silicon oxide films on an integrated circuit (wafer) substrate. This invention is intended to provide improved techniques for growing a silicon oxide film on such substrates.

Silicon dioxide has played a major role in the fabrication of silicon [micro-electronic] devices and their operation since approximately 1958. If a wafer of silicon is heated in an atmosphere of oxygen or water vapor, a film of silicon dioxide is readily formed on its surface. This film is hard, durable [e.g., softening about 1400° C.] and it firmly adheres to the silicon substrate. It makes an excellent electric insulator and is very convenient to use in the fabrication of integrated circuits, serving as a mask for the selective introduction of dopants.

Convenient thicknesses of silicon dioxide can easily be grown in an oxidizing atmosphere at temperatures on the order of 1000° to 1200° C.—thickness being rather precisely controlled by selecting the appropriate time and temperature of oxidation. For example, a 0.1 micrometer layer of oxide will grow on a Si wafer exposed to an atmosphere of pure oxygen for about one hour at a temperature of 1050° C. [substituting steam, for the pure oxygen, will grow a layer five times as thick]. As workers well known, such pyrogenic oxidation is popular for growing such precision silicon dioxide films; it is very convenient and inexpensive to use (several hundred wafers can be simultaneously oxidized in a single run).

More particularly, workers are aware that during the preparation of certain types of integrated circuits, the silicon wafer substrates are oxidized to establish an $SiO_2$ film adjacent silicon nitride mask areas (e.g., to place a thick "Field Oxide" there). It has been found that, in the course of growing such an oxide film (pyrogenically), a deleterious "white ribbon" effect can commonly occur injecting an undesired silicon nitride film under their mask areas. Such "white ribbon" films are commonly formed at a silicon/silicon oxide interface, where an $SiO_2$ layer (thermal buffer) underlies the nitride mask during pyrogenic oxidation accompanied by the presence of nitrogenous products (e.g., believed to include ammonium evolved from the nitride mask; see article by Kooi, et al. page 1117 et seq., Volume 123 of Journal Electro-Chemical Society, 1976).

Such "white ribbon" films have become familiar as potentially disasterous to device yield. As explained below, they are believed to represent the reaction product of ammonium with silicon and constitute a thin silicon nitride film that is quite difficult, expensive and inconvenient to remove [e.g., a special etching might be carried out, but is contra-indicated because of the added time and expense it would involve and because it would likely damage the $SiO_2$ film and the Si substrate.]

It is believed, though not certain, that the nitrogen constituent of the "white ribbon" film finds its way to the film-site by diffusing through the silicon oxide to reach the silicon substrate. Nitrogen is readily diffusible through $SiO_2$ at the prevailing high ambient temperatures, and ammonia gas would appear to be more effective in producing this nitride than molecular nitrogen. However, it is not certain whether these and/or some other "N entity" are operative.

The resultant nitride film has a "masking effect" against oxidation and thus will interfere with the superposition of an oxide layer. For instance, a "white ribbon" spot will obstruct a "gate oxide" of a MOS structure, making it too thin and resulting in unacceptably low gatebreakdown-voltage and device rejection.

OBJECTS OF INVENTION

Accordingly, it is an object of this invention to provide improved techniques for growing silicon oxide on a hot silicon substrate and to provide improved integrated circuits so coated.

Another object is to grow such an oxide coating adjacent silicon nitride layers to be relatively free of undesired silicon nitride residue and the "white ribbon" effect under the nitride layer. It is a further object to provide such oxide coatings free of "white ribbons" as part of a pyrogenic oxidation and despite the presence of nitrogen and/or nitrogen compounds (especially ammoniated gas).

These and other objects and related features of invention are accomplished by the improved techniques taught herein, such as by the addition of hydrogen chloride to the hot oxidizing gases used to grow $SiO_2$—sufficient HCl to combine with any nitrogenous constituents present,—especially where the substrate includes a pure silicon surface adapted to receive a following precision thickness film, and more especially where this Si surface is covered by an $SiO_2$ layer and where "white ribbon" strips are prone to form at the Si/$SiO_2$ interface. This also facilitates removal of gaseous products (of the HCl-ammonia reactions) from the oxide-growth zone.

Also taught are techniques associated with the pyrogenic oxidation of a silicon substrate on which silicon nitride layers are superposed, on intervening $SiO_2$ layers, wherein nitrogen and/or nitrogen compounds are prevented from migrating to the Si-$SiO_2$ interface and forming silicon nitride films there; and particularly where sufficient hydrogen chloride is added to the oxidizing medium to react with free nitrogenous constituents present and so prevent such formation of silicon nitride at this interface; and further to convert such free "N entities" to a gaseous ammonium chloride product which is readily removed from the reaction zone at prevailing process temperatures.

In a preferred embodiment, the invention involves an improved technique for preparing such an Si/$SiO_2$ interface for removal of $SiO_2$ and, formation of a thin, controlled-thickness silicon oxide film there, without "white ribbon" interference—and as involving prescribed pyrogenic oxidizing media at a prescribed processing temperature upon a prescribed silicon wafer substrate (this substrate being susceptible to formation of "white ribbon compounds" at its interface with a silicon oxide film and a "cation portion" of said compound being apt for combination with a prescribed anionic material), this technique being adapted to generate a prescribed vapor compound at said processing temperature and conditions—the technique involving the addition of sufficient of at least one additive reagent including said anionic material to so combine with said cationic material and form said vapor compound at said processing conditions—whereby to eliminate formation of said "white ribbon" interface compounds and to further facilitate the dissipation of the vapor compound product.

In a particular useful form, this anionic material comprises chlorine and the vapor-compound comprises a chloride of nitrogen, with the white ribbon consisting of ultra-thin interface strips of a nitrogen compound. It is preferred that the additive reagent comprise hydrogen chloride and that the vapor compound generated comprise a gaseous chloride of nitrogen, such as ammonium chloride particularly.

In a preferred form, the thin oxide film is to be pyrogenically grown (from a few hundred to a few thousand A°) on prescribed first surface zones of a silicon wafer substrate, with each such zone disposed adjacent respective second zone including silicon oxide—these first zones, in turn, being protectively covered by a silicon nitride mask layer—the "white ribbon strips" being prone to form in the first zones of the substrate, under the mask layer, such as to be left as a troublesome "residue" once the mask layers are removed and prior to growing said thin oxide films.

Techniques according to this invention are especially useful in preventing white ribbon from interfering with the ultra-thin (UT) oxide films to be grown in active gate zones of a silicon wafer for MOS integrated circuits, particularly where, as mentioned, a nitride mask layer overlies an intervening insulation layer of silicon oxide in the gate zone and these mask and insulation layers are to be removed prior to growing such UT films there.

This is particularly true when an ultra-thin $SiO_2$ gate oxide is to be grown only after a first layer of silicon oxide is placed upon the entire wafer, followed by placement of the nitride mask "covers" over each gate zone and extending therebeyond—this being followed by a "field oxide growing" step wherein the original silicon oxide film is thickened, except under the nitride "covers" where, however, it extends a bit under the margin of these covers, and is gradually attenuated in thickness, to form a "beak"— with the mentioned white ribbon spots formed on the substrate, in the gate zones and just beyond these "beak" portions.

Such methods according to the invention have been found particularly effective when used for such purposes in growing oxide pyrogenically (preferably using steam at about 950° C. or more) wherein a first silicon oxide layer (of about 1400 A°) is grown. Then nitride mask layers (about 1500 A°) are applied, and then the field oxide is expanded (to about 1.1 um thickness; HCl added to steam at 950+°C.) and then the nitride "covers" removed along with the underlying silicon oxide layers overlying the gate zones so that the ultra-thin "gate oxide" may then be pyrogenically grown (on the order of 1000 A° thick and free of "white ribbon").

BRIEF DESCRIPTION OF THE DRAWINGS

These and other features and advantages of the invention will be better appreciated by workers as they become familiar with the following detailed description of presently preferred embodiments, these being considered in conjunction with the accompanying drawings, wherein like reference symbols denote like elements.

DETAILED DESCRIPTION OF PREFERRED EMBODIMENTS

As an example of how "white ribbon" is typically evolved, and of how techniques according to the invention can ameliorate this condition, the following description is presented, in conjunction with FIGS. 1-6. Workers will recognize this as involving the preparation of MOS integrated circuit devices —in particular the growth of a thick $SiO_2$ layer ("field oxide") on a silicon wafer. Here, and elsewhere, it may be assumed that, except as otherwise mentioned, conventional techniques, materials and apparatus are employed to render conventional results.

Figure 1:
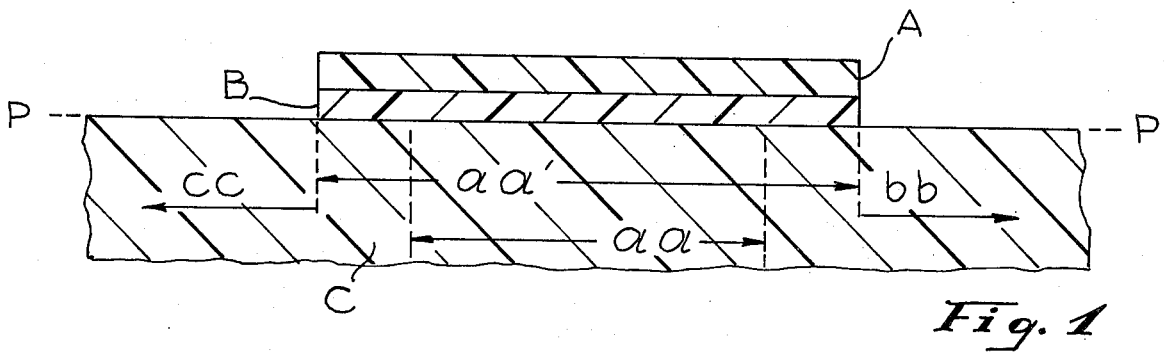
FIGS. 1-6 are sectional idealized illustrations indicating the wafer treatments and associated layering sequences developed during the execution of methods embodying the invention.

As indicated in FIG. 1 this may be understood as involving a silicon wafer substrate C—and particularly, a portion thereof adjacent an "active gate" area ("aa") flanked by adjacent "field" areas ("bb", "cc"). In general it should be understood that an $Si_3N_4$ mask layer A covers the gate area and that a thick $SiO_2$ "field oxide" layer B is to be grown in the field zones ("bb", "cc") flanking gate zone "aa"—then, the mask to be removed and a thin "gate oxide" grown in the gate zone.

FIG. 1 shows the active gate area "aa" also covered insulating $SiO_2$ layer B [e.g., about 1400 A°; this layer being, in turn, covered by the "masking" layer, A, of silicon nitride, here, preferably about 1500 A° of $Si_3N_4$]. Silicon nitride layer A will be understood as functioning conventionally as a mask to prevent oxidation in active area "aa". Silicon oxide layer B serves to prevent the formation of dislocations which might be induced in the silicon substrate C if it were heated in direct contact with the nitride layer. (Thermal stress differential ameliorated by layer B). Oxide layer B will also be understood as influencing the shape of the "sunk-oxide" pattern, discussed below. Preferably, as illustrated, layers A and B are extended a bit beyond active zone "aa" [see dimension aa'].

Figure 2:
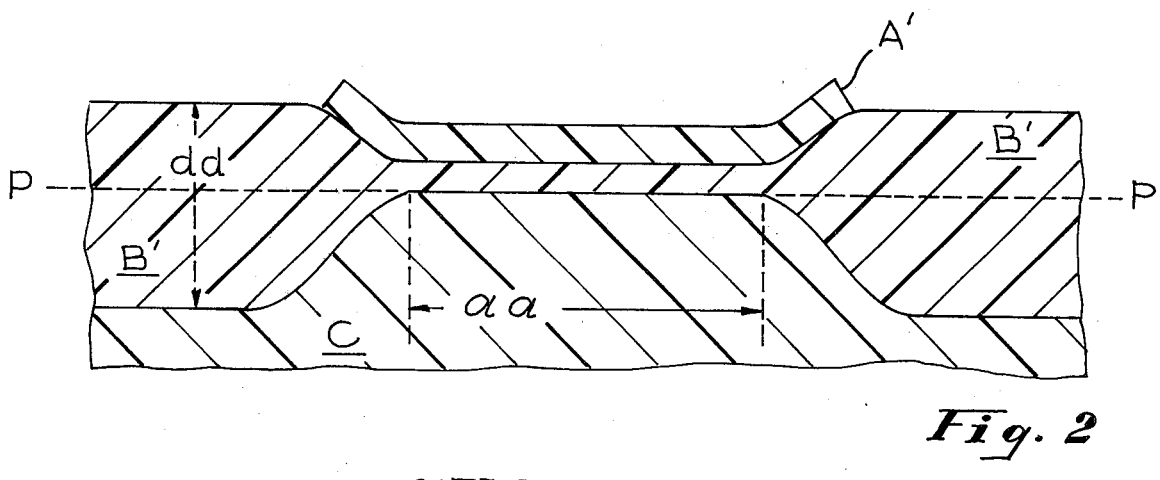

Pyrogenic Oxidation:

As depicted schematically in FIG. 2, a relatively conventional pyrogenic oxidation is next invoked to grow the thick "field oxide" and produce the "sunk oxide" formation [see nitride layer A' depressed into wafer C above zone "aa"]. Here, a steam oxidation is preferred [10 hours at 950° C. in wet oxygen atmosphere: dew point: 95° C.]. This thickens the $SiO_2$ film B' over the "field" areas "bb", "cc" [see layer B', with a maximum thickness "dd" on the order of about 1.1 um., preferably; narrowing to a "beak-like" point, or transition, under mask A' where it is joined with the original thin $SiO_2$ layer over gate region "aa"]. The presence of original oxide layer B (FIG. 1) will be understood as influencing the shape of this "sunk-oxide" pattern, while a lateral oxidation effect produces the smooth beak-like point under the mask edge (where the mask is "lifted up").

As an example of such pyrogenic oxidation, consider the following:

Several hundred silicon wafers (each approximately 3" diameter, about 200 um. thick) are loaded into receiving slots in several (quartz) "boats", with a few millimeters between adjacent wafers. The boats are injected into a high temperature furnace consisting of a conventional elongate quartz tube surrounded by a cylindrical heating element with means for injecting, and for removing, prescribed streams of process gases.

With the boats of wafers loaded into the open end of the tube and slowly pushed into the hottest portion, oxidation may begin [the initial tube atmosphere when the boats are so loaded consists principally of $N_2$ with a little $O_2$, about 7%]. The temperature in the tube's process zone is typically closely controlled [e.g., to 1° C. or better]. Often the entire procedure is computer-controlled—e.g., with a small "process control computer" monitoring furnace temperature, directing the insertion and withdrawal of boats, and controlling the internal atmosphere and other accessories of the furnace.

Figure 3:
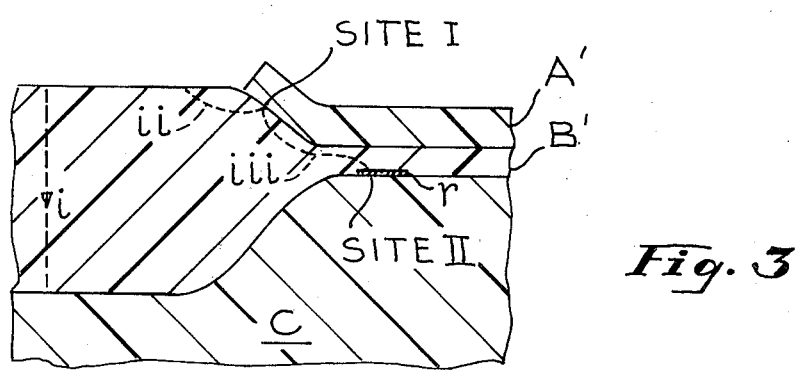

Formation of nitride "white ribbon" under nitride mask:

FIG. 3 is an enlarged partial version of FIG. 2 and schematically depicts what is believed to be the mechanism involved in forming of the nitride "white ribbon" layers r at the interface of silicon oxide layer B' and the top of silicon wafer C in zone "aa" (—where the ribbon underlies mask A', adjacent the mask edge and close to the point of the "oxide-beak").

Figure 4:
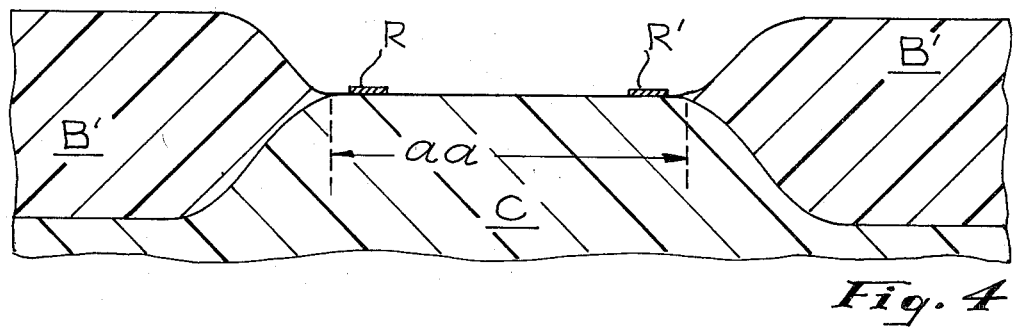

For instance, nitride masking layer A', and the underlying (1400 A°) oxide layer are typically removed (stripped by etching) as indicated schematically in FIG. 4—however, leaving the "white ribbon" nitride strips R,R' as a residue on wafer C in the critical active zone "aa". That is, the conventional treatments (e.g., etching) for removing the nitride mask and the underlying oxide unfortunately, leave the ribbon segments R, R' unaffected [and if a special "ribbon-etch" were used it would inflate production costs and likely degrade the wafer and $SiO_2$ films].

Figure 5:
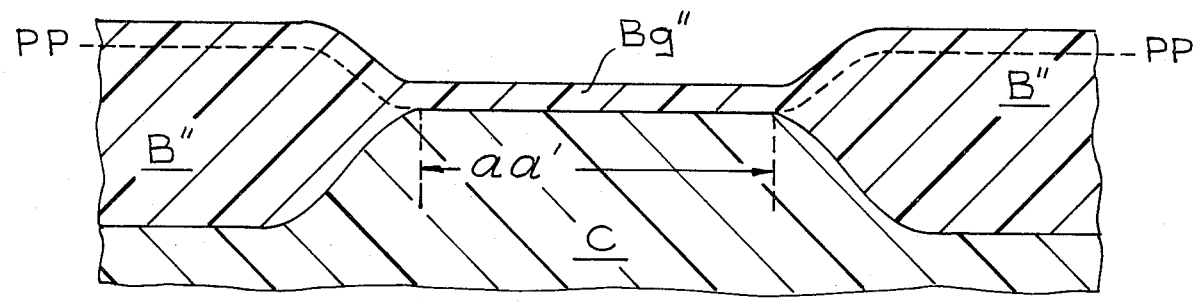

Normally, the "gate oxide" layer should be formed to a very precise thickness over the active (gate) zone (e.g., see conventional gate oxide film $B''_g$ in FIG. 5, shown undisturbed by "white ribbon"). As workers know, it is crucial to good MOS gate operation to form this oxide layer $B''_g$ to a very precisely controlled, highly uniform thickness. And this problem is compounded by the fact that oxide $B''_g$ is so ultra-thin (ordinarily only about 1000 A°).

Figure 5A:
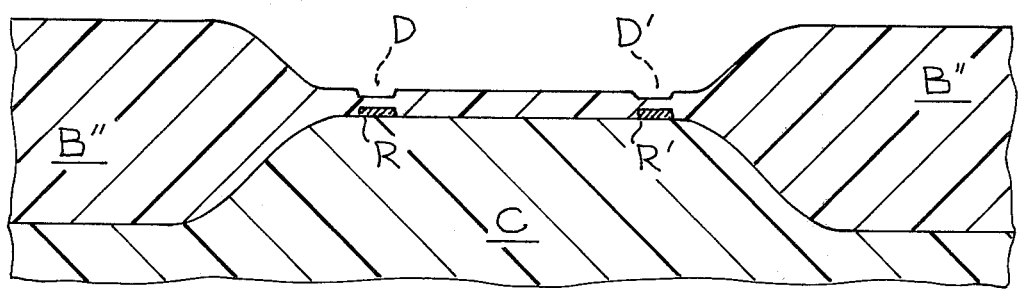

But the "white ribbon" upsets all this and reduces the effective thickness of the gate oxide—as indicated in FIG. 5A, not only by interposition of the reduced-resistivity ribbon thickness R, R', but also by causing less oxide to grow above the ribbons (note depressions D, D' above ribbons R, R' in FIG. 5A). These depressions are, evidently, formed because "free silicon" is depleted at the ribbon sites (i.e., little or no Si available for forming $SiO_2$ above the ribbons because it is tied-up in nitride form). Workers will readily appreciate how disastrous such a two-fold reduction in resistance and dielectric strength (at ribbon sites) can be.

Workers will recognize that the presence of "white ribbon" is entirely unacceptable for such an embodiment since the white ribbon layers will necessarily prevent a proper critical-thickness "gate oxide" layer from being formed in this active zone "aa" and will interfere with formation of a precise, ultra-thin "gate oxide" film (on zone "aa") and degrade desired film properties.

That is, as indicated schematically in FIG. 5A, it will be understood that ultra-thin "gate film" $B''_g$ (e.g., only about 1000 A° nominal thickness $SiO_2$ grown during about 45 minutes oxidation at about 1100° C.) would be reduced in thickness and will exhibit obvious weakened, reduced-thickness areas D, D' above white ribbons R, R'. These weakened areas can be expected to have such a radically reduced resistance and thickness across the gate film and create problems of low gate-breakdown-voltage and device failure, as workers in the art will readily appreciate.

Any further processing of the device is beyond the scope of this discussion, but might include conventional MOS transistor formation [e.g., depositing a polycrystalline silicon film; defining gate, source and drain areas, etc.].

Pecularities of "white ribbon":

While one cannot presently be certain, it appears that the silicon nitride "white ribbon" is produced, generally speaking, when the hot oxidizing medium reacts with any silicon nitride present [e.g., with layer A, FIGS. 1 and 2]. This probably produces [among other things] ammonium, (and possibly nitrogen and other nitrogen compounds) and $SiO_2$ constituents. The nitrogenous reagents thus formed could include ammonia gas or some ammonium compound (and other hydrides of nitrogen), and/or pure (atomic) nitrogen. The nitrogenous reagents are believed to migrate to the $Si/SiO_2$ interface to produce the ribbon nitride film [i.e., $Si_3N_4$, which, as mentioned, cannot readily be removed]. As workers know, this "white ribbon" is readily visible (usually with an optical microscope; hence, it's name) and might, for an embodiment like the foregoing, be about 1 um. ($10^{-6}$ meter) wide. The ribbon location suggests a narrow region of non-oxidized silicon just beyond the point of the "oxide-beak"; this supports the theory of migration of nitrogen (or its compounds) to that site (see site II, FIG. 3).

Workers will remember that the silicon substrate in this active gate zone (adjacent site II) is covered only by a relatively thin $Si_3N_4$ oxidation-mask layer A', Also, some silicon nitride is presumably formed in the ribbon area [at site II, the $Si/SiO_2$ interface] during the local oxidation process above-mentioned. This nitride may, of course, be pure $Si_3N_4$ and/or may comprise related nitrogen compounds.

Various theories have been offered to explain the "white ribbon" effect "e.g., see above cited article, Kooi, et al.]. One theory is based on the transfer of (free) nitrogen from the nitride mask layer A [FIGS. 1 and 2, e.g., from site I in FIG. 3] to the $Si/SiO_2$ interface [as indicated at site II in FIG. 3, for instance]—pure $N_2$ readily passing through $SiO_2$ layer B'. It will, of course, be assumed that the diffusion of steam, normally, through layer B' allows it to interact with the silicon of wafer C to produce $SiO_2$ plus $H_2$, there, conventionally [see path i, FIG. 3].

In addition, it is theorized that a "lateral" diffusion (of $N_2$, etc.) takes place under the edge of mask A' [see path ii], so that when the hot steam reaches a given point along the interface between the mask and $SiO_2$ layer B' [site I or, at least some of it], it will react with the $Si_3N_4$ to produce $SiO_2$ and $NH_3$ (thus helping to form the ultimate beak-shaped pattern indicated—while also oxidizing silicon from substrate C, as for path i). This oxidation of the nitride layer A' will likely occur not only at the top side of layer A' but also on its underside (under the mask edges, there forming $NH_3$ and/or nitrogen atoms or some other NH compound). And, the reactive nitrogen (or N compounds) so formed is assumed to diffuse relatively easily through the $SiO_2$ layer to reach the Si wafer C along the active gate zone [that is, proceeding along path iii to site II, FIG. 3] and form the white ribbon there.

Now, at the outer edge of mask A', it is assumed that little or no $Si_3N_4$ is formed because of the competing oxidation reaction: of Si with hot $H_2O$ vapor. However, at some distance in from the edge of mask A' this will not be so—and, there (site II), Si will be free to combine with the "in-migrating" $NH_3$ to form a $Si_3N_4$ ribbon (—this presumably at a point where the concentration of steam $H_2O$ drops low enough to allow the Si to so react; or, more probably, Si will react there with a mixed compound of silicon, nitrogen, oxygen and possibly, hydrogen—thus forming up the "white ribbon" film).

Thus, as indicated in FIG. 4, when the nitride mask A' and its underlying $SiO_2$ film B' will be understood as removed, the nitride ribbons R, R' nonetheless remaining [typically, up to 10 to 20 A° thick]. Consequently, the "gate oxidation" [layer $B''_g$ in FIG. 5A] will not be effective in gate zone "aa" and defective gate characteristics can be expected.

At times, the white ribbon effect may not be observed because the white ribbon film is removed by an "overetching" operation (presumably unintentional).

HCl Addition:

As a feature of this invention, it was discovered that adding a minor concentration of hydrogen chloride (HCl) to the oxidizing (hot steam) medium can essentially eliminate the white ribbon effect. For instance, with an embodiment like the foregoing, it is feasible to add about 2% HCl to the steam oxidant [at 950° C.] to grow the field oxide (B', FIG. 2). This has been observed to effectively eliminate "white ribbon". Presumably, this is because enough HCL is available adjacent the normal ribbon site to react with the available white ribbon formers ($N_2$ or N compounds—these reacting in the manner of a Lewis Base with the HCl-"Lewis acid" to form $NH_4CL$ gas—a reaction product which, happily, is readily vaporized at the prevailing ambient process temperature).

While workers might be inclined to contemplate various substituents for this HCl additive (to oxidant) many will be found undesirable. For example, other halogen acids appear unsatisfactory and chlorine alone is contraindicated as being too noxious and too corrosive to handle (as well as obviously unable to serve as the described "Lewis Acid").

The $NH_4CL$ vapors are readily swept out of the reaction zone and thus kept from affecting oxidation [$NH_4CL$ is vaporized at about 520° C., whereas the oxidation proceeds at about 950°–1000° C. as mentioned above]. Thus, presumably, the free nitrogenous moiety is prevented from reaching the silicon substrate C (site II, FIG. 3), and cannot form the white ribbon nitride there.

Figure 6:
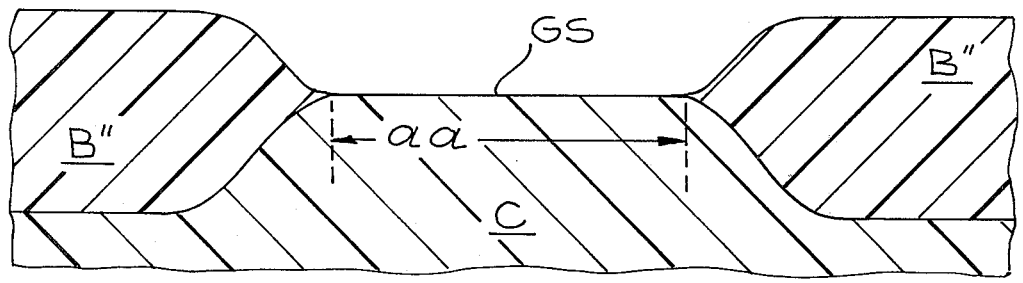

The result is illustrated schematically in FIG. 6 where the stripping steps [removal of nitride layer A' and removal of $SiO_2$ layer B' in the active gate region] will be understood as leaving the gate region "aa", atop silicon wafer C, free of any white ribbon films—and thus the subsequent growth of ultra-thin gate oxide film $B''_g$ (FIG. 5) can proceed unimpeded, unmarred by nitride anomalies or thickness attenuation.

It will be understood that the preferred embodiments described herein are only exemplary, and that the invention is capable of many modifications and variations in construction, arrangement and use without departing from the spirit of the invention.

Workers will understand that others have suggested various other ways of using HCl, or like additives, for other purposes, including that of forming oxide on a circuit substrate [e.g., see U.S. Pat. Nos. 3,549,411, 3,574,677, 3,692,571, Re 28,385 and Re 28,386].

Some modifications of the invention come to mind. For example, other additive agents, besides HCl, may be used for gaining the same effect. The means and methods disclosed herein are also applicable to techniques for growing related precision oxide insulator-films for other applications. Also, the invention is applicable with a plurality of such oxide films—either superposed or side-by-side.

The above examples of possible variations of the present invention are merely illustrative. Accordingly, the present invention is to be considered as including all possible modifications and variations coming within the scope of the invention as defined by the appended claims.

What is claimed is:

1. In an improved technique for forming silicon oxide films with a prescribed wet oxidizing medium at a prescribed processing temperature upon a substrate, this substrate including a silicon constituent and $SiO_2$ film portions thereon, this technique being susceptible to formation of nitrogen interface compounds at the interface of said substrate and the overlying $SiO_2$ layer, a cation portion of said interface compounds being apt for combination with prescribed anionic material to form a prescribed vapor product at said processing temperature, the improvement step comprising: adding sufficient of at least one additive reagent including said anionic material to so combine with said cationic material and form said vapor compound at said processing temperature whereby to eliminate formation of said interface-compounds and to facilitate the dissipation of said vapor compound product.

2. The combination as recited in claim 1, wherein said anionic material comprises chlorine; wherein said vapor-compound comprises a chloride of nitrogen, and wherein said interface-compound comprises a "white ribbon" strip including nitrogen.

3. The combination as recited in claim 2, wherein said additive reagent comprises hydrogen chloride and wherein said vapor compound comprises ammonium chloride.

4. The combination as recited in claim 3, wherein said reagent is added to a pyrogenic oxidizing medium.

5. The combination as recited in claim 4, wherein said medium is essentially comprised of steam.

6. The combination as recited in claim 1, wherein said oxide film is to be grown, pyrogenically, on prescribed first zones on a silicon wafer substrate; wherein each said first zone is formed adjacent a prescribed respective second zone on said substrate, each such second zone including an $SiO_2$ layer and an overlying nitride layer such that when these layers are later removed, white ribbon "strips" formed during the growing of said oxide film are prone to be produced.

7. The combination as recited in claim 6, wherein said thin oxide film comprises from several hundred A° to several um. $SiO_2$ and wherein ultra-thin "gate films" of $SiO_2$ are to be grown on said second zones defining gate zones.

8. The combination as recited in claim 6, wherein said oxide film is grown to comprise $SiO_2$ field-oxide formed to include "beak" marginal portions on edge of the respective adjacent nitride mask layer coming closely adjacent the respective nearby insulation-oxide-layer placed over the nearby second zones, the associated nitride mask layer being formed to extend beyond its respective insulative layer to thereby over-hang the associated "beak" portion of the adjacent field layer; whereby said "white ribbon strips" will be seen to form at the wafer/insulating layer interface just beyond the nearby "beak" portion.

9. The combination as recited in claim 8, wherein said additive reagent comprises hydrogen chloride and wherein said vapor compound comprises ammonium chloride to a pyrogenic oxidizing medium.

10. The combination as recited in claim 9, wherein said medium is essentially comprised of steam, the oxidation forming at about 950° C. or more.

11. The combination as recited in claim 10, wherein said $SiO_2$ insulating layer is first grown on said second zones of the wafer substrate to at least several hundred A°; then silicon nitride mask layers are applied over, and beyond, said insulating layers to a comparable thickness; then said insulating $SiO_2$ layer is "thickened" pyrogenically using said steam—HCL medium, except adjacent said second zones where said "beak" formations develop; then said mask layers are removed, as well as the $SiO_2$ layer in said first zones; and, finally, an ultra-thin gate oxide film is pyrogenically grown on said second zones.

12. In an improved process for growing $SiO_2$ pyrogenically in a wet oxidizing medium on prescribed first surface areas of an Si substrate while leaving adjacent second surface areas of the Si substrate free of nitride residue, these second surface areas being temporarily covered with $SiO_2$ layer and this, in turn, with a nitride layer; those layers to be removed after the subject process and the second Si areas left free of nitride residue, the improvement therein of: adding a portion of hydrogen chloride to the oxidizing medium.

13. An improved method of oxidizing a silicon-rich substrate wherein a wet oxygen flow is used, while the substrate is heated, and wherein nitrogenous materials are present and/or evolved which tend to form "white ribbon", wherein:

a portion of hydrogen chloride is added to the oxidizing medium, sufficient to combine with such nitrogenous materials and substantially reduce, or eliminate, formation of such "white ribbon".

14. The combination as recited in claim 13 wherein, at the prevailing temperatures and related conditions, said portion of hydrogen chloride is added to so combine with said nitrogenous materials to produce a prescribed nitrogenous vapor product.

15. The combination as recited in claim 13 involving the pyrogenic oxidation of said substrate wherein the substrate includes protected surface portions covered with a nitride mask layer and adjacent non-masked surface portions; wherein the oxidation is conducted to grow a thick film of silicon oxide on said non-masked portions of the substrate surface and wherein this is to be followed by removal of said mask layer and formation of a precision-thickness oxide film on said protected surface portions, said "white ribbon" being prone to form on said protected surface portions under said mask layers during pyrogenic growth of the thick film.

16. The combination as recited in claim 15 wherein an $SiO_2$ layer is disposed on said protected surface portions under said mask layer; wherein said "white ribbon" is comprised of a nitride of silicon; wherein said pyrogenic oxidation induces the migration of free nitrogen materials to the "white ribbon" sites, under the edge of said mask layers; and wherein sufficient HCl is added to the oxidizing medium to so combine with said nitrogenous materials as to eliminate "white ribbon" problems.

17. The combination as recited in claim 16 as adapted to an overall process for forming thick field oxide on the non-masked portions and, then, forming ultra-thin "gate oxide" on the protected portions of a silicon-rich integrated circuit substrate, with masking layers of $SiO_2$ covered with a nitride formed on said protected portions and removed before formation of said "gate oxide" there.

18. The combination as recited in claim 19 wherein said pyrogenic oxidation is preceded, first, by formation of an $SiO_2$ film entirely across said wafer substrate; then, by formation of said mask layers; and wherein said pyrogenic oxidation is so carried out, using steam at about 950° C. as to "thicken" this $SiO_2$ film except on said protected surface portions beneath said mask layer, whereby to form said "gate oxide" to a precise, uniform thickness on the order of several hundred A° to a few thousand A°.

* * * * *

UNITED STATES PATENT AND TRADEMARK OFFICE
CERTIFICATE OF CORRECTION

PATENT NO. : 4,401,691

DATED : August 30, 1983

INVENTOR(S) : William Craig Young

It is certified that error appears in the above-identified patent and that said Letters Patent is hereby corrected as shown below:

Col. 1, line 37, change "known," to --know,--;

line 59, change "disadterous" to --disasterous--.

Col. 6, line 41, change ""e.g.," to --[e.g.,--.

Col. 10, line 35, change "19" to --17--.

Signed and Sealed this

Sixth Day of December 1983

[SEAL]

Attest:

GERALD J. MOSSINGHOFF

Attesting Officer  Commissioner of Patents and Trademarks